(12) United States Patent
Wang et al.

(10) Patent No.: US 9,691,792 B2
(45) Date of Patent: Jun. 27, 2017

(54) THIN FILM TRANSISTOR SUBSTRATE AND DISPLAY APPARATUS

(71) Applicant: INNOLUX CORPORATION, Jhu-Nan, Miao-Li County (TW)

(72) Inventors: Chung-Yi Wang, Jhu-Nan (TW); Yao-Lien Hsieh, Jhu-Nan (TW)

(73) Assignee: INNOLUX CORPORATION, Jhu-Non, Miao-Li County (TW)

( * ) Notice: Subject to any disclaimer, the term of this patent is extended or adjusted under 35 U.S.C. 154(b) by 0 days.

(21) Appl. No.: 14/990,110

(22) Filed: Jan. 7, 2016

(65) Prior Publication Data

US 2016/0118413 A1    Apr. 28, 2016

Related U.S. Application Data

(63) Continuation of application No. 14/140,427, filed on Dec. 24, 2013, now Pat. No. 9,263,475.

(30) Foreign Application Priority Data

May 10, 2013   (TW) .............................. 102116735 A

(51) Int. Cl.
*H01L 33/00*    (2010.01)
*H01L 27/12*    (2006.01)
*H01L 29/417*   (2006.01)

(52) U.S. Cl.
CPC ........ *H01L 27/124* (2013.01); *H01L 27/1222* (2013.01); *H01L 29/41733* (2013.01)

(58) Field of Classification Search
CPC ............... H01L 27/124; H01L 27/1222; H01L 29/41733

USPC ................................... 257/88, 351, 369, 386
See application file for complete search history.

(56) References Cited

U.S. PATENT DOCUMENTS

| | | | |
|---|---|---|---|
| 5,191,451 A | 3/1993 | Katayama et al. | |
| 5,286,983 A | 2/1994 | Sakamoto et al. | |
| 5,614,427 A | 3/1997 | Den Boer et al. | |
| 6,255,695 B1 | 7/2001 | Kubota et al. | |
| 6,384,879 B2 | 5/2002 | Someya et al. | |
| 7,629,633 B2 | 12/2009 | Chan et al. | |
| 7,868,960 B2 | 1/2011 | Tsubata et al. | |
| 9,263,475 B2 * | 2/2016 | Wang ................... | H01L 27/124 |
| 2003/0207503 A1 * | 11/2003 | Yamazaki ......... | H01L 29/66765 438/149 |
| 2009/0261338 A1 | 10/2009 | Tsubata et al. | |

* cited by examiner

*Primary Examiner* — Thien F Tran
(74) *Attorney, Agent, or Firm* — Muncy, Geissler, Olds & Lowe, P.C.

(57) ABSTRACT

A thin film transistor (TFT) substrate comprises a substrate, a plurality of pixel electrodes, a gate layer, an active layer, a first source layer and a second source layer, and a drain layer. The pixel electrodes are disposed on the substrate. The gate layer is disposed on the substrate. The active layer is disposed corresponding to the gate layer. The first source layer and the second source layer contact the active layer respectively. The drain layer contacts the active layer and is electrically coupled to one of the pixel electrodes. The gate layer, the active layer, the first source layer and the drain layer constitute a first transistor. The gate layer, the active layer, the second source layer and the drain layer constitute a second transistor. When the first and second transistors are disabled, the first and second source layers are electrically isolated from each other.

20 Claims, 7 Drawing Sheets

THIN FILM TRANSISTOR SUBSTRATE AND DISPLAY APPARATUS

CROSS REFERENCE TO RELATED APPLICATIONS

This application is a continuation application of U.S. Ser. No. 14/140,427, filed on Dec. 24, 2013, which claims priority under 35 U.S.C. §119(a) on Patent Application No(s). 102116735, filed in Taiwan, Republic of China on May 10, 2013, the entire contents of which are hereby incorporated by reference.

BACKGROUND OF THE INVENTION

Field of Invention

The invention relates to a thin film transistor (TFT) substrate and a display apparatus having the TFT substrate.

Related Art

With the progress of technologies, display apparatuses have been widely applied to various kinds of fields. Especially, liquid crystal display (LCD) apparatuses, having advantages such as compact structure, low power consumption, light weight and less radiation, gradually take the place of cathode ray tube (CRT) display apparatuses, and are widely applied to various electronic products, such as mobile phones, portable multimedia devices, notebooks, LCD TVs and LCD screens.

Generally, a display apparatus includes a display panel and a driving module. The driving module includes a scan driving circuit and a data driving circuit. The scan driving circuit is electrically coupled to the display panel through a plurality of scan lines, and the data driving circuit is electrically coupled to the display panel through a plurality of data lines. Besides, the display panel includes a plurality of pixels, and the data lines and the scan lines cross each other to form the pixel array including the pixels. When the scan driving circuit outputs a scan signal to enable the scan line, the data driving circuit transmits the data signals of each column to the corresponding pixel electrodes of the pixels through the corresponding data lines, thereby enabling the display panel to display the image.

The enabling time (i.e. scan time) of the scan signal transmitted through the scan line is determined according to the number of the scan lines and the frame rate. However, the parasitic capacitance on the pixel array of the display panel, such as the parasitic capacitance of the cross over of the data lines and the parasitic capacitance of the switch transistor (e.g. Cgd, Cgs or Csd), and the loading impedance of the pixel may deform and delay an ideal scan signal waveform. This kind of signal delay and deformation (i.e. RC distortion) will become more serious in the case of the large-scale, high definition and 3D display apparatus. For example, the sampling error of the pixel may occur so that the display panel can't correctly display. An effective means for reducing the signal delay and deformation is to decrease the impedance (R) and capacitance (C). In addition to the above-mentioned circuit design, the same effect can be also achieved by improving the efficiency of the circuit layout.

A general procedure of the circuit layout is to draw the equivalent circuit, then convert it into a layout pattern, and finally conduct the production thereby. However, an equivalent circuit can be carried out by various kinds of the layout, so the improvement of the efficiency of the circuit layout is an essential subject for the circuit design.

Therefore, it is an important subject to provide a TFT substrate and a display apparatus having the TFT substrate where the capacitance is decreased by the circuit layout and the layout efficiency per unit area is increased so as to reduce the signal delay and deformation.

SUMMARY OF THE INVENTION

An objective of the invention is to provide a TFT substrate and a display apparatus where the capacitance is decreased by the circuit layout and the layout efficiency per unit area is increased so as to reduce the signal delay and deformation.

To achieve the above objective, a thin film transistor (TFT) substrate according to the invention comprises a substrate, a plurality of pixel electrodes, a gate layer, an active layer, a first source layer and a second source layer, and a drain layer. The pixel electrodes are disposed on the substrate. The gate layer is disposed on the substrate. The active layer is disposed corresponding to the gate layer. The first source layer and the second source layer both contact the active layer. The drain layer contacts the active layer and is electrically coupled to one of the pixel electrodes. The gate layer, the active layer, the first source layer and the drain layer constitute a first transistor. The gate layer, the active layer, the second source layer and the drain layer constitute a second transistor. When the first and second transistors are disabled, the first and second source layers are electrically separate from each other.

To achieve the above objective, a display apparatus according to the invention comprises a thin film transistor (TFT) substrate. The TFT substrate comprises a substrate, a plurality of pixel electrodes, a gate layer, an active layer, a first source layer and a second source layer, and a drain layer. The pixel electrodes are disposed on the substrate. The gate layer is disposed on the substrate. The active layer is disposed corresponding to the gate layer. The first source layer and the second source layer both contact the active layer. The drain layer contacts the active layer and is electrically coupled to one of the pixel electrodes. The gate layer, the active layer, the first source layer and the drain layer constitute a first transistor. The gate layer, the active layer, the second source layer and the drain layer constitute a second transistor. When the first and second transistors are disabled, the first and second source layers are electrically separate from each other.

In one embodiment, the gate layer includes a first zone, the active layer includes a second zone, and the first zone and the second zone overlap each other according to the vertical direction of the TFT substrate.

In one embodiment, the area of the first zone is larger than that of the second zone.

In one embodiment, the first source layer and the second source layer are disposed adjacent to the drain layer.

In one embodiment, the thin film transistor substrate further comprises a third source layer, which is disposed on the substrate and contacts the active layer. The gate layer, the active layer, the third source layer and the drain layer constitute a third transistor.

In one embodiment, when the first, second and third transistors are disabled, the first, second and third source layers are electrically separate from one another.

In one embodiment, the thin film transistor substrate further comprises another drain layer, which is disposed on the substrate and contacts the active layer. The gate layer, the active layer, the first source layer and the another drain layer constitute a third transistor.

As mentioned above, in the TFT substrate and the display apparatus according to the invention, the gate layer is disposed corresponding to the active layer, the first source layer and the second source layer both contact the active layer, and the drain layer contacts the active layer and is electrically coupled to one of the pixel electrodes. Besides, the gate layer, the active layer, the first source layer and the drain layer constitute a first transistor, and the gate layer, the active layer, the second source layer and the drain layer constitute a second transistor. Moreover, when the first and second transistors are disabled, the first and second source layers are electrically separate from each other. Because the active layers of the different TFT devices having the same drain layer are made one by the layout manner, the area of the active layer of the first and second transistors is decreased and thus the overlap area with the capacitance between the gate layer and the active layer is reduced. Therefore, in the TFT substrate and the display apparatus according to the invention, the parasitic capacitance is decreased and the layout efficiency per unit area is increased, and thus the driving ability of the transistor per unit area can be increased and the signal delay and deformation can be reduced.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

The difference between the circuit layout of the present invention and that of the prior art will be illustrated by referring to the related figures. In the invention, the active layers of the different TFT devices having the same drain layer are made one by the layout manner, and therefore the capacitance can be reduced so that the layout efficiency per unit area can be increased. The circuit layout manner and the concept of the invention are applied to the TFT substrate and the display apparatus having the TFT substrate. To be noted, the circuit as below is just an example for the illustration, showing the concept applied to circuit layout of the TFT substrate and the display apparatus to reduce the parasitic capacitance thereof, increase the layout efficiency per unit area, and reduce the signal delay and deformation.

Figure 1A:
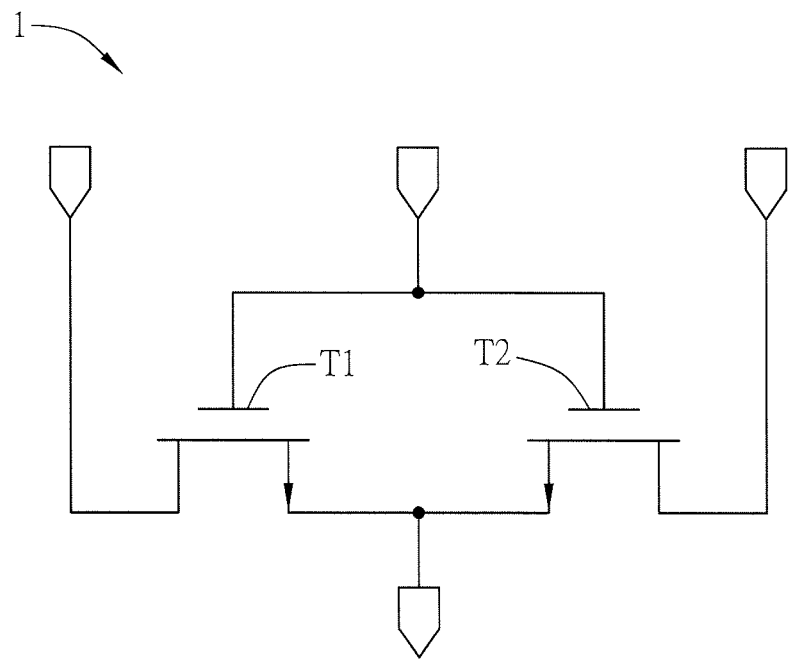
FIG. 1A is a schematic diagram of a circuit included by the TFT substrate according to an embodiment of the invention.
Figure 1B:
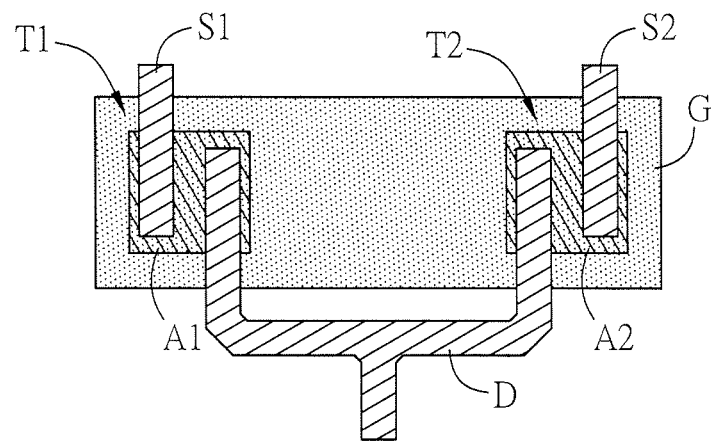
FIG. 1B is a schematic diagram of a conventional circuit layout for the circuit in FIG. 1A.
Figure 1C:
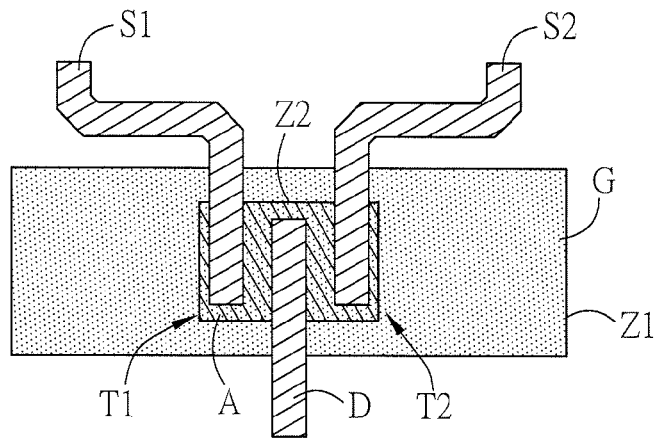
FIG. 1C is a schematic diagram of a circuit layout according to a preferred embodiment of the invention for the circuit in FIG. 1A.

FIG. 1A is a schematic diagram of a circuit 1 included by the TFT substrate according to an embodiment of the invention, FIG. 1B is a schematic diagram of a conventional circuit layout for the circuit 1 in FIG. 1A, and FIG. 1C is a schematic diagram of a circuit layout according to a preferred embodiment of the invention for the circuit 1 in FIG. 1A.

As shown in FIG. 1A, the circuit 1 includes a first transistor T1 and a second transistor T2, and the first and second transistors T1 and T2 are both thin film transistors (TFTs) and disposed on a substrate (not shown) for example. The gates of the first and second transistors T1 and T2 are electrically coupled to each other, and the drains thereof are also electrically coupled to each other. Therefore, when the gates of the first and second transistors T1 and T2 are enabled by the signal, the signal of the source of the first transistor T1 can be transmitted to the drain of the first transistor T1 while the signal of the source of the second transistor T2 can be transmitted to the drain of the second transistor T2.

As shown in FIG. 1C, the TFT substrate of the invention includes a substrate (not shown), a plurality of pixel electrodes (not shown), a gate layer G, an active layer A, a first source layer S1, a second source layer S2 and a drain layer D.

The pixel electrodes are disposed on the substrate, and the gate layer G is also disposed on the substrate. The material of the gate layer G includes, for example, metal (e.g. aluminum, copper, silver, molybdenum, titanium) or alloy, and the gate layer G can be a single-layer or multi-layer structure. The wire for transmitting driving signals, such as the scan lines, can be the same layer as the gate layer, and they can be made by the same process and electrically coupled to each other.

The active layer A is disposed corresponding to the gate layer G. As an embodiment, the active layer A can be a semiconductor layer, and includes an oxide semiconductor for example but is not limited thereto. The oxide semiconductor includes an oxide, and the oxide includes at least one of indium, zinc, gallium and hafnium, or other material. The oxide semiconductor is, for example but not limited to, IGZO, HIZO, ZnO or $In_2O_3$.

The first and second source layers S1 and S2 contact the active layer A respectively, and the drain layer D also contacts the active layer A. An interval is between the first source layer S1 and the drain layer D, and another interval is between the second source layer S2 and the drain layer D. Herein, the gate layer G, the active layer A, the first source layer S1 and the drain layer D constitute the first transistor T1, and the gate layer G, the active layer A, the second source layer S2 and the drain layer D constitute the second transistor T2. Each of the first transistor T1 and the second transistor T2 can be a transistor of bottom gate or top gate, and in this embodiment they are both transistors of bottom gate, having the active layer A disposed over the gate layer G. When the active layer A of the first transistor T1 is disabled, the first source layer S1 is electrically isolated from the drain layer D, and when the active layer A of the second transistor T2 is disabled, the second source layer S2 is electrically isolated from the drain layer D.

The first source layer S1 and the second source layer S2 are disposed adjacent to the drain layer D. In other words, the first or second source layer S1 or S2 can be disposed on the upper side, lower side, left side or right side of the drain layer D. For example, the first and second source layers S1 and S2 are disposed on the left and right sides of the drain layer D, respectively. Each of the first and second transistors T1 and T2 can include a dielectric layer, an insulating layer, a protection layer or other layers (not shown). The material of the first source layer S1, second source layer S2 and drain layer D includes, for example, metal (e.g. aluminum, copper, silver, molybdenum, titanium) or alloy. Each of the first source layer S1, second source layer S2 and drain layer D can be a single-layer or multi-layer structure. The wire for transmitting driving signals, such as the data lines, can be the same layer as the first source layer S1, second source layer S2 and drain layer D, and they can be made by the same process.

In the conventional layout as shown in FIG. 1B, because the gate of the first transistor T1 and the gate of the second transistor T2 are electrically coupled to each other, the first and second transistors T1 and T2 have the same gate layer G. Besides, because the drain of the first transistor T1 and the drain of the second transistor T2 are electrically coupled to each other, the first and second transistors T1 and T2 also have the same drain layer D. However, the first active layer A1 of the first transistor T1 and the second active layer A2 of the second transistor T2 are separate from each other.

By contrast, in the layout of the invention as shown in FIG. 1C, besides having the same gate layer G and the drain layer D, the first and second transistors T1 and T2 includes the same active layer A. In the vertical direction of the TFT substrate, the active layer A overlaps the gate layer G. In detail, the active layer A is made on a single area during the manufacturing process of the active layer of the first and second transistors T1 and T2, and defined as the active layer of the first and second transistors T1 and T2. Therefore, the active layers of the different TFT devices having the same drain layer are made one by the layout manner so that the capacitance can be reduced and the layout efficiency per unit area can be increased.

In FIG. 1C, when the first and second transistors T1 and T2 are disabled (that means the gate G doesn't receive the Vgh signal), the first and second source layers S1 and S2 are electrically isolated from each other. Moreover, the drain layer D is electrically coupled to one of the pixel electrodes of the TFT substrate. The gate layer G includes a first zone Z1, the active layer A includes a second zone Z2, and the first zone Z1 and the second zone Z2 overlap each other in the vertical direction of the TFT substrate. Besides, the area of the first zone Z1 is larger than that of the second zone Z2.

By comparing FIG. 1B and FIG. 1C, the total area of the first and second active layers A1 and A2 in FIG. 1B is 392 $\mu m^2$, and the area of the second zone Z2 of the active layer A in FIG. 1C is just 308 $\mu m^2$, which is less than the conventional one by 21.4% for the layout area. A capacitance is formed by the two opposite conductive films, so if one of the films is reduced in area, the overlap area therebetween can be decreased and thus the parasitic capacitance can be reduced. Accordingly, the layout efficiency per unit area is increased so that the driving ability of the transistor per unit area can be increased and the signal delay and deformation of the display apparatus can be reduced. Therefore, by the layout manner as shown in FIG. 1C, the parasitic capacitance of the TFT substrate and display apparatus having the TFT substrate of the invention can be reduced, the layout efficiency per unit area can be increased, and the signal delay and deformation can be reduced.

Figure 2A:
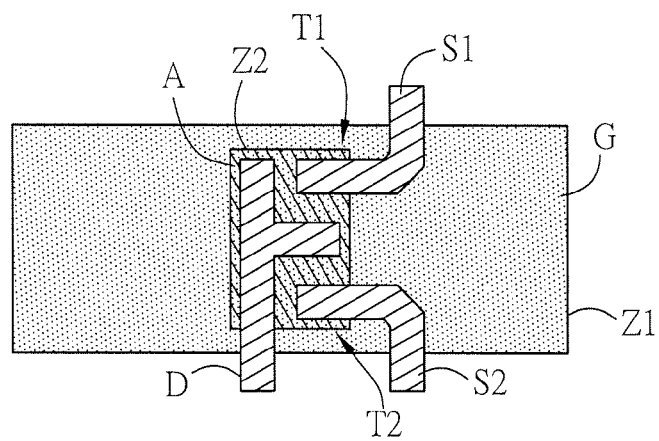
FIGS. 2A and 2B are schematic diagrams showing some variations of the circuit layout for the circuit in FIG. 1A.
Figure 2B:
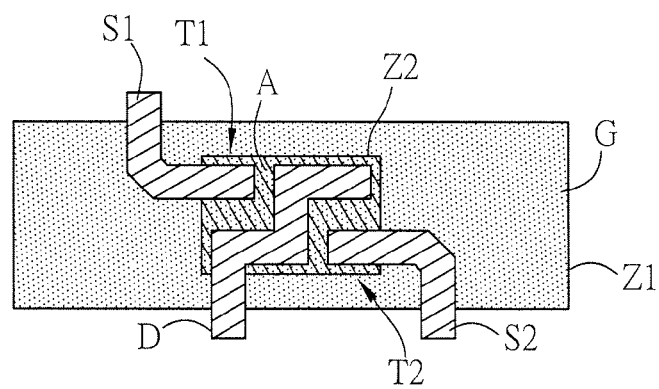

FIGS. 2A and 2B are schematic diagrams showing some variations of the circuit layout for the circuit 1 in FIG. 1A.

In FIG. 1C, the first and second source layers S1 and S2 are disposed on the left and right sides of the drain layer D, respectively. However, in FIG. 2A, the first and second source layers S1 and S2 are disposed on the right sides, i.e. the upper and lower right sides, of the drain layer D. Besides, the area of the second zone Z2 of the active layer A of this embodiment is just 330 $\mu m^2$, which is less than the conventional one in FIG. 1B by 15.82% for the layout area.

Mainly different from the case of FIG. 2A, the first and second source layers S1 and S2 in FIG. 2B are disposed on the upper left side and the lower right side, respectively. Besides, the area of the second zone Z2 of the active layer A of this embodiment is just 336 $\mu m^2$, which is less than the conventional one in FIG. 1B by 14.29% for the layout area.

The circuit layouts in FIGS. 2A and 2B can be comprehended by referring to the case of FIG. 1C, and therefore they are not described here for conciseness.

Figure 3A:
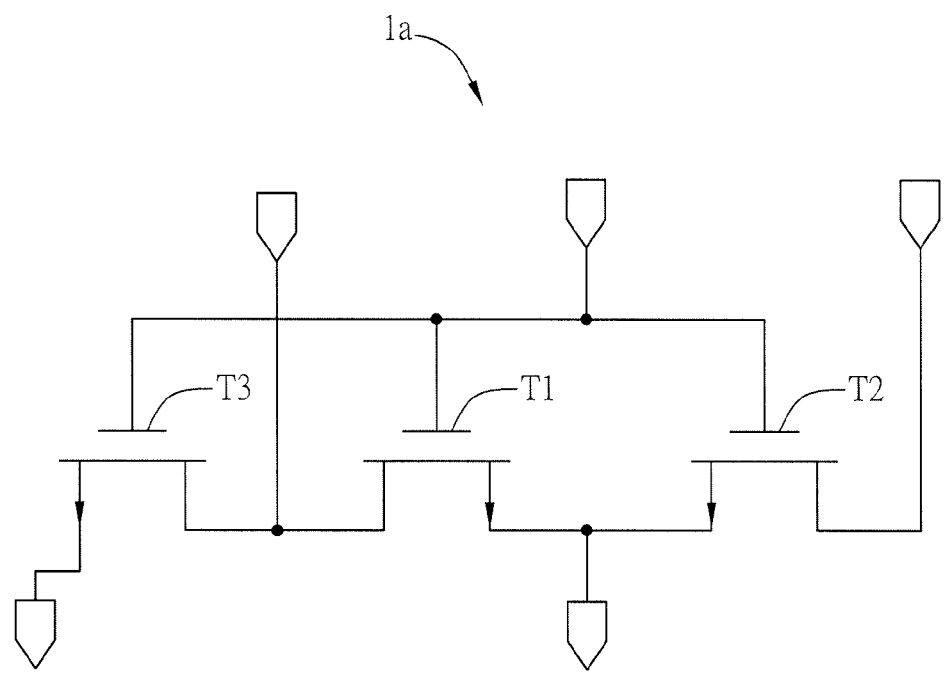
FIG. 3A is a schematic diagram of a circuit included by the TFT substrate according to another embodiment of the invention.
Figure 3B:
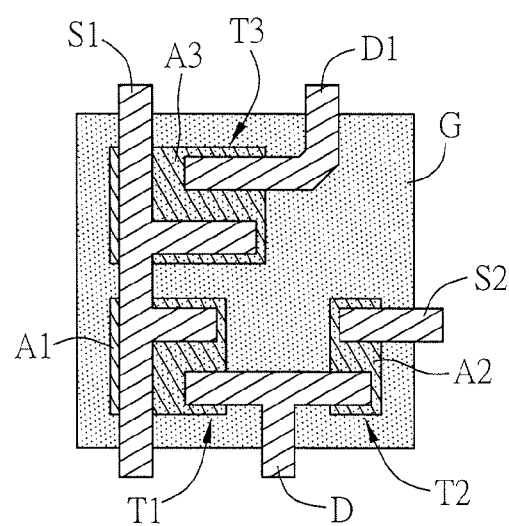
FIG. 3B is a schematic diagram of a conventional circuit layout for the circuit in FIG. 3A.
Figure 3C:
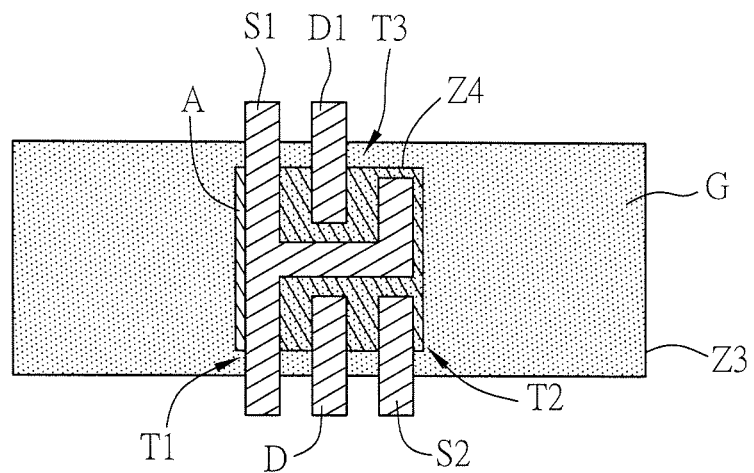
FIG. 3C is a schematic diagram of a circuit layout according to a preferred embodiment of the invention for the circuit in FIG. 3A.

FIG. 3A is a schematic diagram of a circuit 1a included by the TFT substrate according to another embodiment of the invention, FIG. 3B is a schematic diagram of a conventional circuit layout for the circuit 1a in FIG. 3A, and FIG. 3C is a schematic diagram of a circuit layout according to a preferred embodiment of the invention for the circuit 1a in FIG. 3A.

Mainly different from the circuit 1 in FIG. 1A, the circuit 1a in FIG. 3A further includes a third transistor T3. The gate of the third transistor T3 is electrically coupled to the gates of the first and second transistors T1 and T2, and the source of the third transistor T3 is electrically coupled to the source of the first transistor T1.

In the conventional layout of FIG. 3B, the gate layer G, a third active layer A3, a first source layer S1 and a drain layer D1 constitute the third transistor T3. The first, second and third transistors T1, T2, T3 include the same gate layer G, the first and second transistors T1 and T2 include the same drain layer D, but the drain layer D1 of the third transistor T3 is separate from the drain layer D of the first and second transistors T1 and T2. Besides, the first active layer A1 of the first transistor T1, the second active layer A2 of the second transistor T2, and the third active layer A3 of the third transistor T3 are separate from one another. Moreover, the third active layer A3 overlaps the gate layer G.

In the layout of the invention as shown in FIG. 3C, the gate layer G, the active layer A, the first source layer S1 and the drain layer D1 constitute the third transistor T3, and the first, second and third transistors T1, T2 and T3 include the same active layer A. In detail, the active layer A is made on a single area during the manufacturing process of the active layer of the first, second and third transistors T1, T2, T3, and defined as the active layer of the first, second and third transistors T1, T2, T3.

The total area of the first, second and third active layers A1, A2, A3 in conventional FIG. 3B is 539 $\mu m^2$, and the area of a fourth zone Z4 of the active layer A in FIG. 3C is 484 $\mu m^2$, which is less than the conventional one in FIG. 3B by 10.2% for the layout area.

Figure 4A:
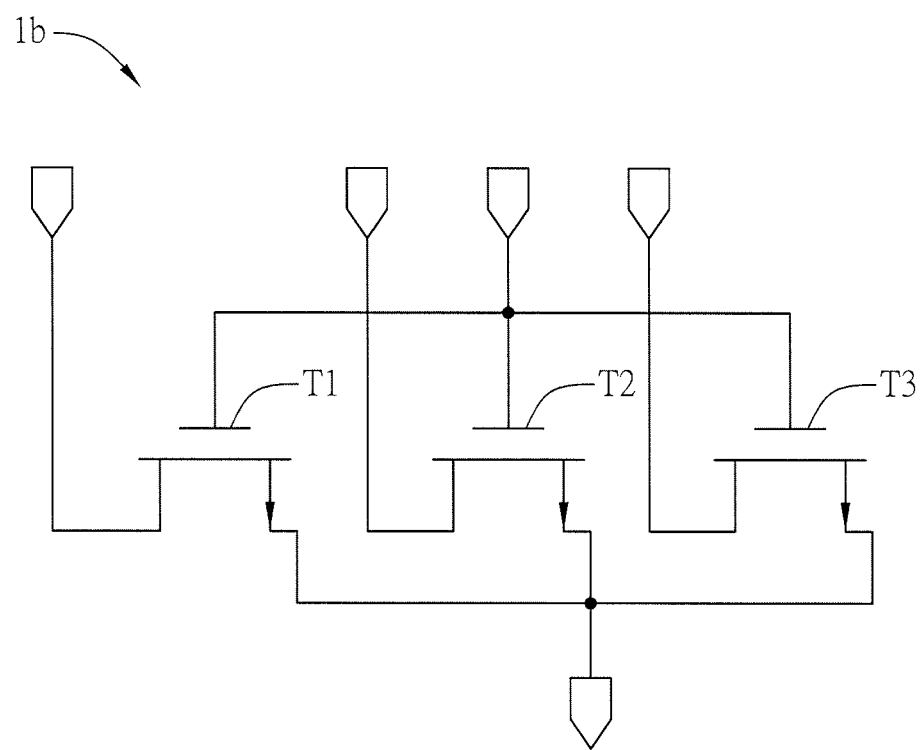
FIG. 4A is a schematic diagram of a circuit included by the TFT substrate according to another embodiment of the invention.
Figure 4B:
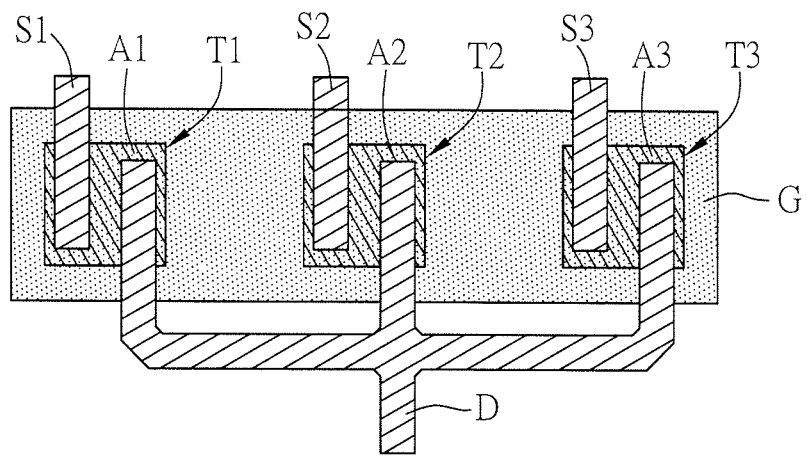
FIG. 4B is a schematic diagram of a conventional circuit layout for the circuit in FIG. 4A.
Figure 4C:
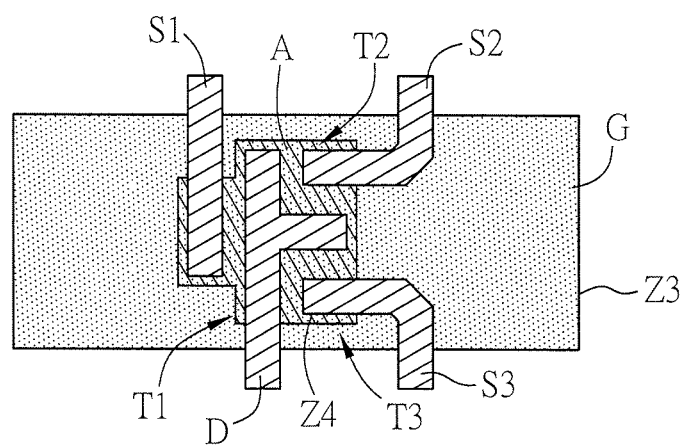
FIG. 4C is a schematic diagram of a circuit layout according to a preferred embodiment of the invention for the circuit in FIG. 4A.

FIG. 4A is a schematic diagram of a circuit 1b included by the TFT substrate according to another embodiment of the invention, FIG. 4B is a schematic diagram of a conventional circuit layout for the circuit 1b in FIG. 4A, and FIG. 4C is a schematic diagram of a circuit layout according to a preferred embodiment of the invention for the circuit 1b in FIG. 4A.

Mainly different from the circuit 1 in FIG. 1A, the circuit 1b in FIG. 4A further includes a third transistor T3 disposed on the substrate. The gate of the third transistor T3 is electrically coupled to the gates of the first and second transistors T1 and T2, and the drain of the third transistor T3 is electrically coupled to the drain of the first transistor T1 and the drain of the second transistor T2.

In the conventional layout in FIG. 4B, because the gate of the first transistor T1, the gate of the second transistor T2 and the gate of the third transistor T3 are electrically coupled together, the first, second and third transistors T1, T2, T3 include the same gate layer G. Because the drain of the first transistor T1, the drain of the second transistor T2 and the drain of the third transistor T3 are electrically coupled together, the first, second and third transistors T1, T2, T3 include the same drain layer D. However, the first active layer A1 of the first transistor T1, the second active layer A2 of the second transistor T2 and the third active layer A3 of the third transistor T3 are separate from one another.

However, in the layout of the invention in FIG. 4C, the first, second and third transistors T1, T2 and T3 include the same gate layer G, the same drain layer D and the same active layer A. According to the vertical direction of the TFT substrate, the active layer A overlaps the gate layer G. Besides, the drain layer D of the first, second and third transistors T1, T2 and T3 is electrically coupled to one of the pixel electrodes (not shown) of the TFT substrate. When the first, second and third transistors T1, T2, T3 are disabled, the first, second and third source layers S1, S2, S3 are electrically isolated from one another. Moreover, the gate layer G includes a third zone Z3, the active layer A includes a fourth zone Z4, and the third zone Z3 and the fourth zone Z4 overlap each other according to the vertical direction of the TFT substrate. Besides, the area of the third zone Z3 is larger than that of the fourth zone Z4.

The total area of the first, second and third active layers A1, A2, A3 in FIG. 4B is 588 $\mu m^2$. In the layout of FIG. 4C, the area of the fourth zone Z4 of the active layer A is 426 $\mu m^2$, which is less than the conventional one (i.e. 588 $\mu m^2$) by 27.55% for the layout area.

Figure 5A:
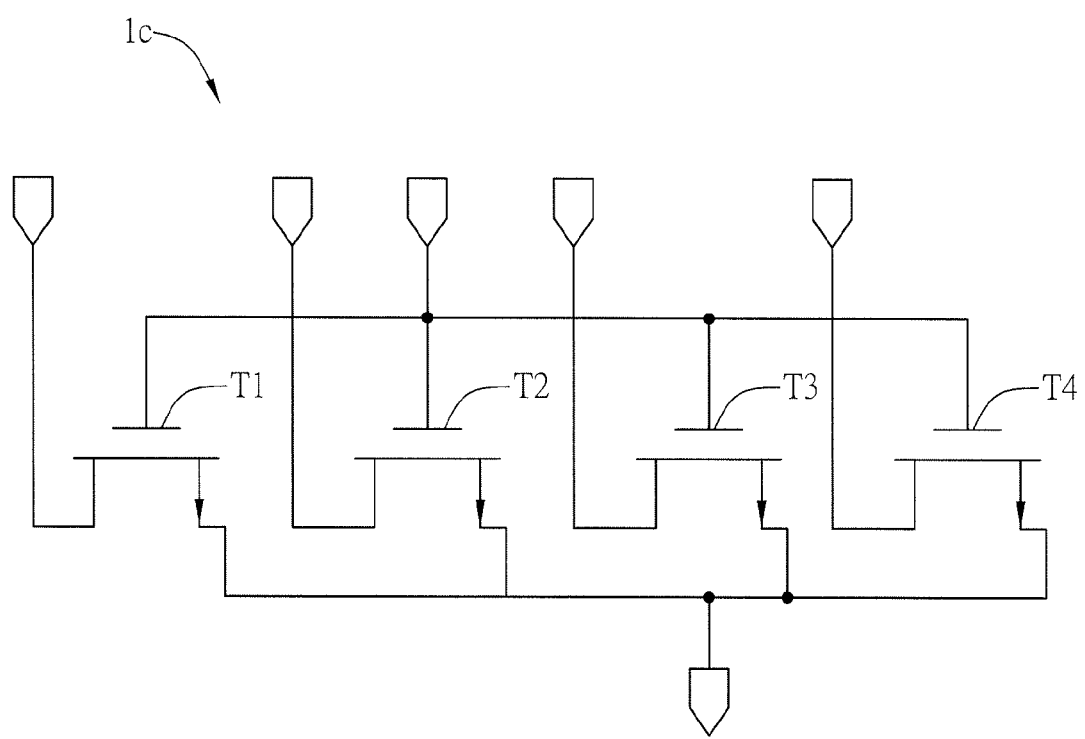
FIG. 5A is a schematic diagram of a circuit included by the TFT substrate according to another embodiment of the invention.
Figure 5B:
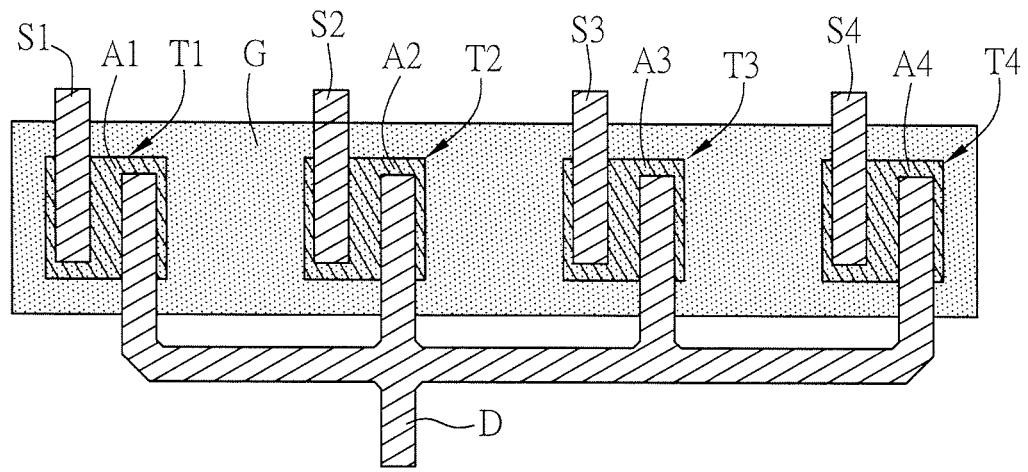
FIG. 5B is a schematic diagram of a conventional circuit layout for the circuit in FIG. 5A.
Figure 5C:
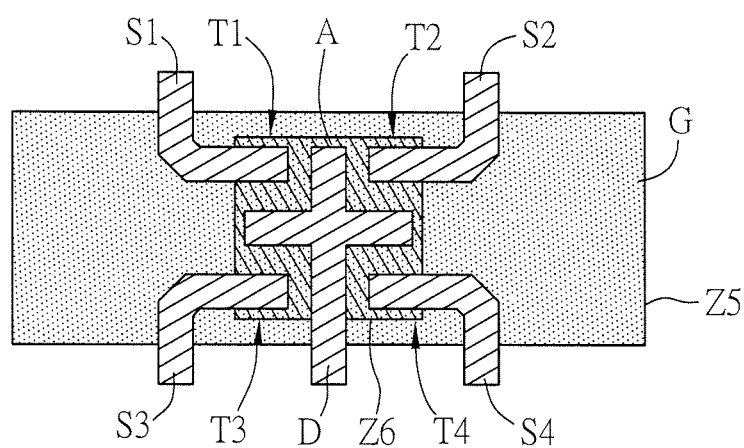
FIG. 5C is a schematic diagram of a circuit layout according to a preferred embodiment of the invention for the circuit in FIG. 5A.

FIG. 5A is a schematic diagram of a circuit 1c included by the TFT substrate according to another embodiment of the invention, FIG. 5B is a schematic diagram of a conventional circuit layout for the circuit 1c in FIG. 5A, and FIG. 5C is a schematic diagram of a circuit layout according to a preferred embodiment of the invention for the circuit 1c in FIG. 5A.

Mainly different from the circuit 1b in FIG. 4A, the circuit 1c in FIG. 5A further includes a fourth transistor T4 disposed on the substrate. The gate of the fourth transistor T4 is electrically coupled to the gates of the first, second and third transistors T1, T2, T3, and the drain of the fourth transistor T4 is electrically coupled to the drain of the first transistor T1, the drain of the second transistor T2 and the drain of the third transistor T3.

In the conventional layout in FIG. 5B, the first, second, third and fourth transistors T1, T2, T3, T4 include the same gate layer G. The first, second, third and fourth transistors T1, T2, T3, T4 include the same drain layer D. However, the first active layer A1 of the first transistor T1, the second active layer A2 of the second transistor T2, the third active layer A3 of the third transistor T3 and the fourth active layer A4 of the fourth transistor T4 are separate from one another.

However, in the layout of the invention in FIG. 5C, the first, second, third and fourth transistors T1, T2, T3, T4 include the same gate layer G, the same drain layer D and the same active layer A. According to the vertical direction of the TFT substrate, the active layer A overlaps the gate layer G. Besides, the drain layer D of the first, second, third and fourth transistors T1, T2, T3, T4 is electrically coupled to one of the pixel electrodes (not shown) of the TFT substrate. When the first, second, third and fourth transistors T1, T2, T3, T4 are disabled, the first, second, third and fourth source layers S1, S2, S3, S4 are electrically isolated from one another. Moreover, the gate layer G includes a fifth zone Z5, the active layer A includes a sixth zone Z6, and the fifth zone Z5 and the sixth zone Z6 overlap each other according to the vertical direction of the TFT substrate. Besides, the area of the fifth zone Z5 is larger than that of the sixth zone Z6.

The total area of the first, second, third and fourth active layers A1, A2, A3, A4 in FIG. 5B is 784 $\mu m^2$. In the layout of FIG. 5C, the area of the sixth zone Z6 of the active layer A is 528 $\mu m^2$, which is less than the conventional one (i.e. 784 $\mu m^2$) by 32.65% for the layout area.

The display apparatus of the invention includes any of the above-mentioned TFT substrates or their any combination, and the circuit layout of the TFT substrate can be comprehended by referring to the above illustrations and is therefore not described here for conciseness. The display apparatus can be an LCD apparatus or an OLED display apparatus. As to the LCD apparatus for example, in addition to the TFT substrate, the LCD apparatus can further include an opposite substrate, a liquid crystal layer and a backlight module. The opposite substrate is disposed opposite to the TFT substrate, and the liquid crystal layer is disposed between the TFT substrate and the opposite substrate. Besides, the backlight module is disposed on the side of the TFT substrate away from the opposite substrate.

To be noted, in the invention, the active layers of the different TFT devices having the same drain layer are made one by the layout manner, and thus the capacitance can be reduced and the layout efficiency per unit area can be increased. Therefore, this invention is not limited to the foregoing circuits. A circuit and the related layout manner will fall within the scope of the TFT substrate and the display apparatus having the TFT substrate of the invention as long as it conforms to the above-mentioned concept.

In summary, in the TFT substrate and the display apparatus according to the invention, the gate layer is disposed corresponding to the active layer, the first source layer and the second source layer both contact the active layer, and the drain layer contacts the active layer and is electrically coupled to one of the pixel electrodes. Besides, the gate layer, the active layer, the first source layer and the drain layer constitute a first transistor, and the gate layer, the active layer, the second source layer and the drain layer constitute a second transistor. Moreover, when the first and second transistors are disabled, the first and second source layers are electrically isolated from each other. Because the active layers of the different TFT devices having the same drain layer are made one by the layout manner, the area of the active layer of the first and second transistors is decreased and thus the overlap area with the capacitance between the gate layer and the active layer is reduced. Therefore, in the TFT substrate and the display apparatus according to the invention, the parasitic capacitance is decreased and the layout efficiency per unit area is increased, and thus the driving ability of the transistor per unit area can be increased and the signal delay and deformation can be reduced.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display apparatus, comprising:
a thin film transistor (TFT) substrate comprising:
a substrate;
a plurality of pixel electrodes disposed on the substrate;
a gate layer disposed on the substrate;
an active layer disposed corresponding to the gate layer;
a first source layer and a second source layer contacting the active layer respectively; and
a drain layer contacting the active layer, wherein the drain layer has a first portion extending along a first direction, the drain layer has a second portion extending along a second direction, the first direction is different from the second direction, the first portion connects to the second portion to form at least one cavity, and part of the first source layer or part of the second source layer is disposed in the at least one cavity,
wherein the gate layer, the active layer, the first source layer and the drain layer define a first transistor, and the gate layer, the active layer, the second source layer and the drain layer define a second transistor, and when the first transistor and the second transistor are disabled, the first source layer and the second source layer are electrically isolated from each other,
wherein the active layer of the first transistor is direct physically connected to the active layer of the second transistor, the sum of the number of the first source layer and the second source layer disposed on the active layer is greater than the number of the drain layer disposed on the active layer.

2. The display apparatus as recited in claim 1, wherein the first portion connects to the second portion to form a first cavity and a second cavity, the first source layer is disposed corresponding to the first cavity and the second source layer is disposed corresponding to the second cavity.

3. The display apparatus as recited in claim 2, wherein the first cavity is facing a third direction and the second cavity is facing a fourth direction.

4. The display apparatus as recited in claim 3, wherein the third direction is different to the fourth direction.

5. The display apparatus as recited in claim 4, wherein the first third direction is opposite to the fourth direction.

6. The display apparatus as recited in claim 1, wherein the first source layer is electrically connected to one of the pixel electrodes.

7. The display apparatus as recited in claim 1, wherein the second source layer is electrically connected to one of the pixel electrodes.

8. The display apparatus as recited in claim 1, wherein the gate layer includes a first zone, the active layer includes a second zone, and the first zone and the second zone overlap each other in the vertical direction of the TFT substrate.

9. The display apparatus as recited in claim 8, wherein the area of the first zone is larger than that of the second zone.

10. The display apparatus as recited in claim 1, wherein the first source layer and the second source layer are disposed adjacent to the drain layer.

11. A thin film transistor (TFT) substrate comprising:
a substrate;
a plurality of pixel electrodes disposed on the substrate;
a gate layer disposed on the substrate;
an active layer disposed corresponding to the gate layer;
a first source layer and a second source layer contacting the active layer respectively; and
a drain layer contacting the active layer, wherein the drain layer has a first portion extending along a first direction, the drain layer has a second portion extending along a second direction, the first direction is different from the second direction, the first portion connects to the second portion to form at least one cavity, and part of the first source layer or part of the second source layer is disposed in the at least one cavity,
wherein the gate layer, the active layer, the first source layer and the drain layer define a first transistor, and the gate layer, the active layer, the second source layer and the drain layer define a second transistor, and when the first transistor and the second transistor are disabled, the first source layer and the second source layer are electrically isolated from each other,
wherein the active layer of the first transistor is direct physically connected to the active layer of the second transistor, the sum of the number of the first source layer and the second source layer disposed on the active layer is greater than the number of the drain layer disposed on the active layer.

12. The thin film transistor substrate as recited in claim 11, wherein the first portion connects to the second portion to form a first cavity and a second cavity, the first source layer is disposed corresponding to the first cavity and the second source layer is disposed corresponding to the second cavity.

13. The thin film transistor substrate as recited in claim 12, wherein the first cavity is facing a third direction and the second cavity is facing a fourth direction.

14. The thin film transistor substrate as recited in claim 13, wherein the third direction is different to the second direction.

15. The thin film transistor substrate as recited in claim 14, wherein the third direction is opposite to the fourth direction.

16. The thin film transistor substrate as recited in claim 11, wherein the first source layer is electrically connected to one of the pixel electrodes.

17. The thin film transistor substrate as recited in claim 11, wherein the second source layer is electrically connected to one of the pixel electrodes.

18. The thin film transistor substrate as recited in claim 11, wherein the gate layer includes a first zone, the active layer includes a second zone, and the first zone and the second zone overlap each other in the vertical direction of the TFT substrate.

19. The thin film transistor substrate as recited in claim 18, wherein the area of the first zone is larger than that of the second zone.

20. The thin film transistor substrate as recited in claim 11, wherein the first source layer and the second source layer are disposed adjacent to the drain layer.

* * * * *